United States Patent
Kim et al.

(10) Patent No.: US 9,772,709 B2
(45) Date of Patent: *Sep. 26, 2017

(54) ORGANIC LIGHT EMITTING DISPLAY DEVICE

(71) Applicant: SAMSUNG DISPLAY CO., LTD., Yongin, Gyeonggi-Do (KR)

(72) Inventors: Young-Dae Kim, Yongin (KR); Jong-Hyun Choi, Yongin (KR); Choong-Youl Im, Yongin (KR); Il-Jeong Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/149,759

(22) Filed: May 9, 2016

(65) Prior Publication Data

US 2016/0253017 A1    Sep. 1, 2016

Related U.S. Application Data

(63) Continuation of application No. 12/409,375, filed on Mar. 23, 2009, now Pat. No. 9,342,176.

(Continued)

(51) Int. Cl.
*G06F 3/041* (2006.01)
*H01L 27/32* (2006.01)
*G06F 3/044* (2006.01)

(52) U.S. Cl.
CPC ............ *G06F 3/0412* (2013.01); *G06F 3/044* (2013.01); *H01L 27/323* (2013.01);

(Continued)

(58) Field of Classification Search
CPC ......... G06F 2203/04111; G06F 3/0412; G06F 3/044; H01L 2251/308; H01L 2251/5338;
(Continued)

(56) References Cited

U.S. PATENT DOCUMENTS 5,550,659 A    8/1996   Fujieda et al.
6,879,319 B2   4/2005   Cok
(Continued)

FOREIGN PATENT DOCUMENTS

CN    101197390 A    6/2008
DE    103 08 514 A1   9/2004
(Continued)

OTHER PUBLICATIONS

Chinese Registration Determination Certificate dated May 4, 2016, issued in corresponding Chinese Patent Application No. 201310148034.0 (23 pages).

(Continued)

*Primary Examiner* — Afroza Chowdhury
(74) *Attorney, Agent, or Firm* — Lewis Roca Rothgerber Christie LLP

(57) ABSTRACT

An organic light emitting display device having an electrostatic capacitive type touch panel function with reduced thickness and improved luminance. A display panel of the organic light emitting display device includes a substrate, a display unit having a plurality of pixels on the substrate, and a touch sensing unit on the display unit. The touch sensing unit includes an encapsulation substrate and a capacitive pattern layer on a side of the encapsulation substrate facing the display unit. The capacitive pattern layer has a plurality of openings corresponding in position to the plurality of pixels.

24 Claims, 12 Drawing Sheets

Related U.S. Application Data

(60) Provisional application No. 61/082,424, filed on Jul. 21, 2008.

(52) U.S. Cl.
CPC ...... *H01L 27/3244* (2013.01); *G06F 2203/04111* (2013.01); *H01L 2251/308* (2013.01); *H01L 2251/5338* (2013.01); *H01L 2251/5392* (2013.01)

(58) Field of Classification Search
CPC ............ H01L 2251/5392; H01L 27/323; H01L 27/3244
See application file for complete search history.

(56) References Cited

U.S. PATENT DOCUMENTS

| | | | |
|---|---|---|---|
| 6,980,184 | B1 | 12/2005 | Stewart et al. |
| 7,063,902 | B2 | 6/2006 | Kikuchi et al. |
| 7,133,032 | B2 | 11/2006 | Cok |
| 7,394,458 | B2 | 7/2008 | Lyon et al. |
| 7,439,962 | B2 | 10/2008 | Reynolds et al. |
| 7,724,243 | B2 | 5/2010 | Geaghan |
| 7,737,637 | B2 | 6/2010 | Koshihara et al. |
| 7,864,502 | B2 | 1/2011 | Boyd et al. |
| 7,879,037 | B2 | 2/2011 | Brunnett et al. |
| 7,936,121 | B2 | 5/2011 | Kim |
| 7,936,338 | B2 | 5/2011 | Iwase |
| 8,052,498 | B2 | 11/2011 | Chien et al. |
| 8,154,530 | B2 | 4/2012 | Lin et al. |
| 8,223,278 | B2 | 7/2012 | Kim et al. |
| 8,283,851 | B2 | 10/2012 | Kim et al. |
| 8,743,078 | B2 | 6/2014 | Kim |
| 8,928,597 | B2 | 1/2015 | Jang |
| 9,342,176 | B2 * | 5/2016 | Kim .................. G06F 3/0412 |
| 2002/0005928 | A1 | 1/2002 | Hanakawa et al. |
| 2003/0006971 | A1 | 1/2003 | Blanchard |
| 2003/0006972 | A1 | 1/2003 | Blanchard |
| 2003/0199144 | A1 | 10/2003 | Atobe et al. |
| 2003/0234759 | A1 | 12/2003 | Bergquist |
| 2004/0080267 | A1 | 4/2004 | Cok |
| 2004/0095332 | A1 | 5/2004 | Blanchard |
| 2004/0135520 | A1 | 7/2004 | Park et al. |
| 2005/0001964 | A1 | 1/2005 | Kubo et al. |
| 2005/0030048 | A1 | 2/2005 | Bolender et al. |
| 2005/0077820 | A1 | 4/2005 | Onishi et al. |
| 2005/0093466 | A1 | 5/2005 | Matsumoto |
| 2005/0248270 | A1 | 11/2005 | Ghosh et al. |
| 2005/0258441 | A1 | 11/2005 | Shitagami |
| 2006/0033016 | A1 | 2/2006 | Ogawa et al. |
| 2006/0044501 | A1 | 3/2006 | Mizusako |
| 2006/0097251 | A1 | 5/2006 | Kang |
| 2006/0097991 | A1 | 5/2006 | Hotelling et al. |
| 2006/0109222 | A1 | 5/2006 | Lee et al. |
| 2006/0119590 | A1 | 6/2006 | Park et al. |
| 2006/0232559 | A1 | 10/2006 | Chien et al. |
| 2006/0250592 | A1 | 11/2006 | Noguchi et al. |
| 2006/0274055 | A1 | 12/2006 | Reynolds et al. |
| 2007/0046186 | A1 | 3/2007 | Kim |
| 2007/0062739 | A1 | 3/2007 | Philipp et al. |
| 2007/0216657 | A1 | 9/2007 | Konicek |
| 2007/0240914 | A1 | 10/2007 | Lai et al. |
| 2007/0242054 | A1 | 10/2007 | Chang et al. |
| 2007/0242055 | A1 | 10/2007 | Lai |
| 2007/0268243 | A1 | 11/2007 | Choo et al. |
| 2008/0001926 | A1 | 1/2008 | XiaoPing et al. |
| 2008/0007534 | A1 | 1/2008 | Peng et al. |
| 2008/0138657 | A1 | 6/2008 | Lee et al. |
| 2008/0165158 | A1 | 7/2008 | Hotelling et al. |
| 2008/0211395 | A1 | 9/2008 | Koshihara et al. |
| 2008/0246704 | A1 | 10/2008 | Kawase |
| 2008/0277259 | A1 | 11/2008 | Chang |
| 2008/0278787 | A1 | 11/2008 | Sasagawa |
| 2008/0278788 | A1 | 11/2008 | Sasagawa |
| 2008/0309633 | A1 | 12/2008 | Hotelling et al. |
| 2008/0309635 | A1 | 12/2008 | Matsuo |
| 2009/0072724 | A1 | 3/2009 | Seki et al. |
| 2009/0160822 | A1 | 6/2009 | Eguchi et al. |
| 2009/0213090 | A1 | 8/2009 | Mamba et al. |
| 2009/0251431 | A1 | 10/2009 | Lee et al. |
| 2009/0303195 | A1 | 12/2009 | Yamato et al. |
| 2010/0007616 | A1 | 1/2010 | Jang |
| 2010/0013745 | A1 | 1/2010 | Kim et al. |
| 2010/0110041 | A1 | 5/2010 | Jang |
| 2010/0207864 | A1 | 8/2010 | Tashiro et al. |
| 2010/0214247 | A1 | 8/2010 | Tang et al. |
| 2011/0032209 | A1 | 2/2011 | Kim |
| 2011/0057893 | A1 | 3/2011 | Kim et al. |

FOREIGN PATENT DOCUMENTS

| | | |
|---|---|---|
| EP | 1 930 968 A2 | 6/2008 |
| EP | 1 930 968 A3 | 6/2011 |
| JP | 03-134925 | 6/1991 |
| JP | 07-036017 | 2/1995 |
| JP | 2003-196023 | 7/2003 |
| JP | 2005-521207 | 7/2005 |
| JP | 2005-339406 | 12/2005 |
| JP | 2006-302251 | 11/2006 |
| JP | 2007-086075 | 4/2007 |
| JP | 2007-299385 | 11/2007 |
| JP | 2008-009476 | 1/2008 |
| JP | 2008-310551 | 12/2008 |
| KR | 2003-0028973 | 4/2003 |
| KR | 10-2006-0044254 | 5/2006 |
| KR | 10-2006-73513 | 6/2006 |
| KR | 10-0612240 B1 | 8/2006 |
| KR | 10-0743545 B1 | 7/2007 |
| KR | 10-2007-0102414 | 10/2007 |
| KR | 10-2008-80913 | 9/2008 |
| KR | 10-2008-0110477 | 12/2008 |
| KR | 10-2009-0058072 | 6/2009 |
| KR | 10-2009-68165 | 6/2009 |
| TW | 200739400 | 10/2007 |
| TW | 200739402 A | 10/2007 |
| WO | WO 03/079449 A1 | 9/2003 |
| WO | WO 2008/002043 A1 | 1/2008 |
| WO | WO 2008/032476 A1 | 3/2008 |
| WO | WO 2008/047990 A1 | 4/2008 |

OTHER PUBLICATIONS

European Search Report dated Sep. 14, 2011, for corresponding European Patent application 09251837.2, noting listed references in this IDS (Category X and Y only), 9 pages.

Japanese Office action dated Aug. 2, 2011, for corresponding Japanese Patent application 2009-163881, noting references in this IDS, 4 pages.

KIPO Registration Determination Certificate dated Jun. 17, 2011, for corresponding Korean Patent application 10-2009-0053489, noting listed foreign references in this IDS.

U.S. Office action dated Jun. 23, 2011, for cross-reference U.S. Appl. No. 12/350,101, 13 pages.

KIPO Office action dated Jan. 7, 2011, for corresponding Korean Patent application 10-2009-0053490, noting listed reference in this IDS.

European Search Report dated Nov. 12, 2009, for European application 09251664.0, noting listed references in this IDS.

KIPO Registration Determination Certificate dated Oct. 31, 2011, for corresponding Korean Patent application 10-2009-0053490, noting listed references in this IDS, as well as references previously submitted in an IDS dated Mar. 16, 2011, 5 pages.

U.S. Office action dated Dec. 1, 2011, for cross reference U.S. Appl. No. 12/350,101, 14 pages.

Japanese Office action dated Feb. 28, 2012, for corresponding Japanese Patent application 2009-163880, 2 pages.

European Office action dated May 22, 2012, for corresponding European Patent application 09251837.2, (9 pages).

U.S. Office action dated May 23, 2012, for cross-reference U.S. Appl. No. 12/350,101, (15 pages).

(56) References Cited

OTHER PUBLICATIONS

SIPO Office action dated Jul. 24, 2012, for Chinese Patent application 200910138692.5, (7 pages).
European Office action dated Aug. 23, 2012, for corresponding European Patent application 09251664.0, (6 pages).
Japanese Office action dated Jan. 15, 2013, for corresponding Japanese Patent application 2011-140402, (2 pages).
KIPO Office action dated Feb. 16, 2011, for Korean Patent application 10-2009-0072401, (4 pages).
JPO Office action dated Apr. 9, 2013, for Japanese Patent application 2012-076237, (2 pages).
U.S. Office action dated Jul. 3, 2012, for cross reference U.S. Appl. No. 12/790,062, (12 pages).
U.S. Office action dated Jul. 18, 2013, for cross reference U.S. Appl. No. 12/790,062, (17 pages).
U.S. Notice of Allowance dated Sep. 11, 2013, for cross reference U.S. Appl. No. 12/350,101, (9 pages).
U.S. Office action dated Sep. 19, 2013, for cross reference U.S. Appl. No. 12/684,005, (15 pages).
SIPO Office action dated Dec. 2, 2013, for Chinese Patent application 200910138692.5, (8 pages).

* cited by examiner

ORGANIC LIGHT EMITTING DISPLAY DEVICE

CROSS-REFERENCE TO RELATED APPLICATIONS

This application is a continuation of U.S. patent application Ser. No. 12/409,375, filed on Mar. 23, 2009, which claims priority to and the benefit of U.S. Provisional Patent Application No. 61/082,424, filed on Jul. 21, 2008, the entire content of which is incorporated herein by reference. This application is related to U.S. patent application Ser. No. 12/350,101 filed on Jan. 7, 2009, the entire content of which is incorporated herein by reference.

BACKGROUND OF THE INVENTION

1. Field of the Invention

The present invention relates to an organic light emitting display device, and more particularly, to an organic light emitting display device having a touch panel function.

2. Description of the Related Art

Among various kinds of flat display devices, an organic light emitting display device is an active matrix type display device with a wide viewing angle, high contrast, and fast response speed. In comparison to an inorganic light emitting display device, the organic light emitting display device having an emissive layer formed of an organic material has improved performance in terms of luminance, driving voltage, response speed, and multi-color realization.

Also, in order to allow a user to input a command via a finger or a pen-type pointer, it is desirable to provide an organic light emitting display device having a touch panel function, such as an internal electrostatic capacitive type touch panel display device.

However, a typical organic light emitting display device having an internal electrostatic capacitive type touch panel has increased thickness in order to embed the touch panel function. Another problem is that indium tin oxide (ITO) electrodes are disposed on the entire surface of an encapsulation substrate to provide the touch panel function such that light emitted from organic light emitting diodes (OLEDs) is absorbed by the ITO electrodes, thereby degrading the luminance of the emitted light.

SUMMARY OF THE INVENTION

Embodiments of the present invention provide an organic light emitting display device including an encapsulation substrate, an inner surface of which is patterned using an indium tin oxide (ITO) pattern and openings are formed in the ITO pattern corresponding to an emission layer of an organic light emitting diode (OLED), so that a touch panel function can be obtained without increasing the thickness of a touch panel and with improved luminance.

According to an embodiment of the present invention, a display panel includes a substrate and a display unit on the substrate. The display unit includes a plurality of pixels. A touch sensing unit is provided on the display unit, and the touch sensing unit includes an encapsulation substrate and a capacitive pattern layer on a side of the encapsulation substrate facing the display unit. The capacitive pattern layer has a plurality of openings corresponding in position to the plurality of pixels.

The capacitive pattern layer may include a plurality of pattern units arranged in a matrix pattern.

Each of the plurality of pattern units may have at least one of the plurality of openings.

The plurality of pattern units may include a plurality of first pattern units arranged in columns extending in a first direction and a plurality of second pattern units arranged in rows extending in a second direction crossing the first direction.

The plurality of first pattern units may be electrically coupled

The display panel may further include a first insulation layer on the plurality of first pattern units and the plurality of second pattern units.

The display panel may further include a plurality of connectors on the first insulation layer for electrically coupling adjacent units of the plurality of second pattern units.

The display panel may further include a second insulation layer on the plurality of connectors.

The display panel may further include a first insulation layer between the plurality of first pattern units and the plurality of second pattern units, wherein the plurality of first pattern units are between the encapsulation substrate and the first insulation layer, and the plurality of second pattern units are on the first insulation layer.

The display panel may further include a second insulation layer on the plurality of second pattern units.

Each of the plurality of pattern units may have a substantially quadrilateral shape.

Each of the plurality of pattern units may have a substantially diamond or rectangular shape.

An opening of the plurality of openings may correspond in position to at least one pixel of the plurality of pixels.

The opening of the plurality of openings may correspond in position to only one pixel of the plurality of pixels.

The pixel may be a subpixel.

A center of the opening may be substantially aligned with a center of the pixel in a direction substantially normal to the side of the encapsulation substrate.

Each of the plurality of openings may have substantially the same shape as that of a corresponding pixel of the plurality of pixels.

An opening of the plurality of openings may have an area substantially identical to or larger than an area of a pixel of the plurality of pixels in size.

The plurality of openings may be arranged in a pattern corresponding to an arrangement pattern of the plurality of pixels.

The plurality of openings may be identical to or less than the plurality of pixels in number.

The touch sensing unit may further include a plurality of extending units on the side of the encapsulation substrate for electrically coupling the capacitive pattern layer to the substrate.

The display panel may further include a conductive member between the substrate and the touch sensing unit for coupling the plurality of extending units to the substrate.

The capacitive pattern layer may include a material selected from the group consisting of ITO, IZO, ZnO, In2O3, and combinations thereof.

The display unit may be an organic light emitting display.

Another embodiment of the present invention provides a method of fabricating a display panel having a touch sensing interface. A display unit is provided on a substrate, and the display unit includes a plurality of pixels. A capacitive pattern layer is formed on a side of an encapsulation substrate. A plurality of openings are formed in the capacitive pattern layer corresponding in position to the plurality of pixels and the encapsulation substrate is attached to the substrate with the display unit facing the capacitive pattern layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE EMBODIMENTS OF THE INVENTION

The present invention will now be described more fully with reference to the accompanying drawings, in which exemplary embodiments of the present invention are shown.

First Embodiment

Figure 1:
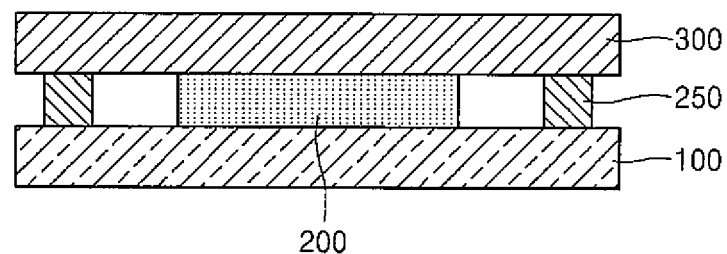
FIG. 1 is a schematic drawing illustrating a cross-sectional view of a portion of an organic light emitting display device according to a first embodiment of the present invention.
Figure 2:
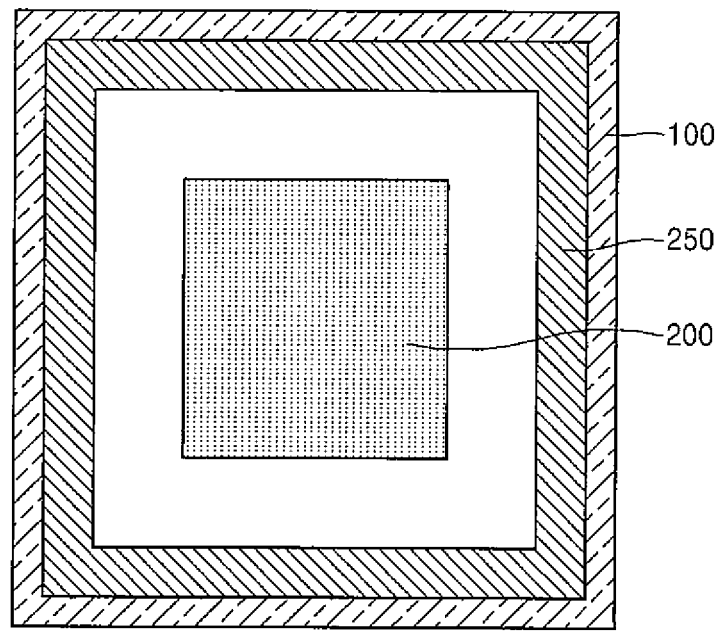
FIG. 2 is a schematic drawing illustrating a plan view of the organic light emitting display device of FIG. 1.

FIG. 1 is a schematic drawing illustrating a cross-sectional view of a portion of an organic light emitting display device according to a first embodiment of the present invention, and FIG. 2 is a schematic drawing illustrating a plan view of the organic light emitting display device of FIG. 1. In FIG. 2, an encapsulation substrate 300 illustrated in FIG. 1 is not shown.

Referring to FIGS. 1 and 2, a display unit 200 including a plurality of organic light emitting diodes (OLEDs) is formed on a substrate 100.

The substrate 100 is, for example, formed of a transparent glass containing $SiO_2$ as a main component, but the present invention is not limited thereto, and thus the substrate 100 may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

When the organic light emitting display device of FIGS. 1 and 2 is a bottom emission type organic light emitting display device in which an image is viewed from the side of display device where the substrate 100 is located, the substrate 100 is desirably formed of a transparent material. However, when the organic light emitting display device of FIGS. 1 and 2 is a top emission type organic light emitting display device in which an image is viewed from the side of the display device that is away from the substrate 100, the substrate 100 may not be formed of a transparent material, and, for example, the substrate 100 may be formed of a metal material. When the substrate 100 is formed of a metal material, the substrate 100 may include at least one material selected from the group consisting of carbon, iron, chromium, manganese, nickel, titanium, molybdenum, stainless steel (SUS), Invar alloys, Inconel alloys, and Kovar alloys, but the present invention is not limited thereto, and thus the substrate 100 may also be formed of any suitable metal foil.

In addition, a buffer layer may be further formed on a top surface of the substrate 100 so as to planarize the substrate 100 and prevent (or block) impurities from penetrating into a bottom emission type organic light emitting display device including the substrate 100.

The substrate 100, having the display unit 200 formed thereon, is attached to the encapsulation substrate 300 with the display unit 200 therebetween. The encapsulation substrate 300 may be formed of a glass material, various plastic materials such as acryl, and a metal material. The encapsulation substrate 300 and touch panel related members formed on a surface of the encapsulation substrate 300 will be described later with reference to FIGS. 4A-4E.

In FIGS. 1 and 2, the substrate 100 and the encapsulation substrate 300 are attached to each other by using a sealant 250. The sealant 250 may be a sealing glass frit, as generally used in the art. Also, the sealant 250 may be formed of an organic sealant, an inorganic sealant, or a mixture of the organic and inorganic sealants.

Hereinafter, a structure of the display unit 200 in the organic light emitting display device according to the first embodiment of the present invention will be described in more detail.

Figure 3:
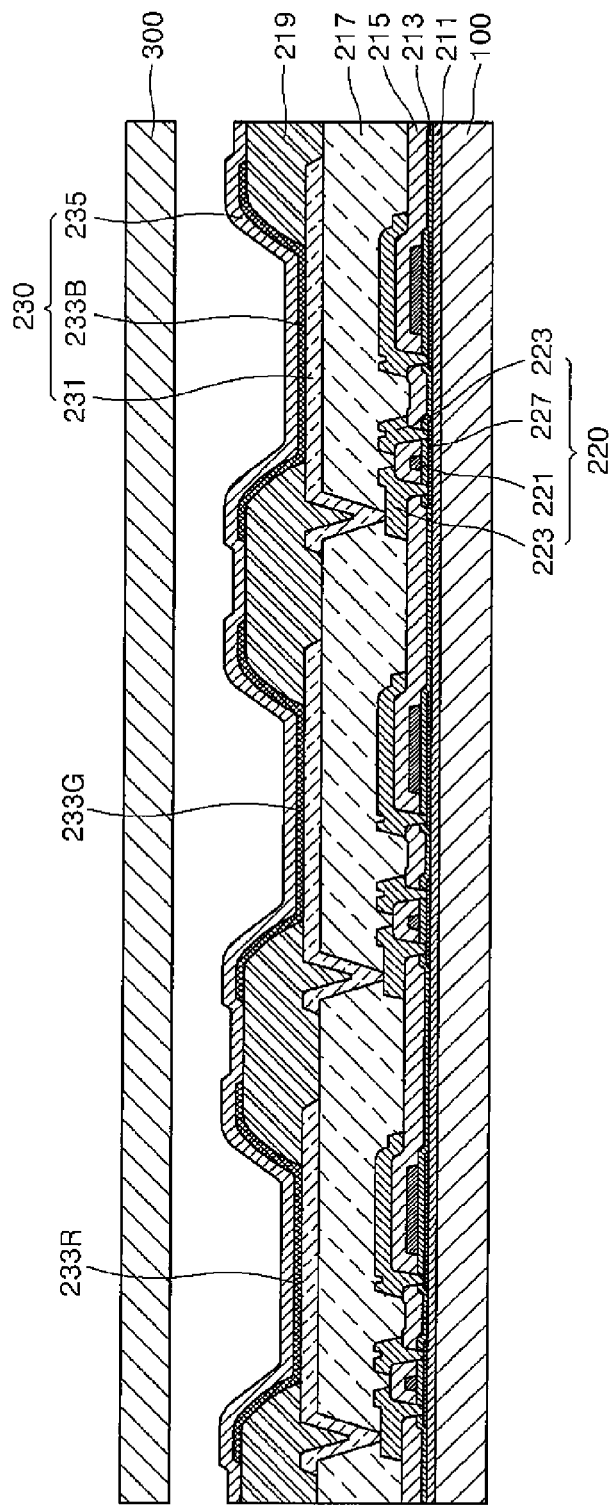
FIG. 3 is a schematic drawing illustrating a cross-sectional view of a portion of the organic light emitting display device of FIG. 1.

FIG. 3 is a schematic drawing illustrating a cross-sectional view of a portion of the organic light emitting display device of FIG. 1 and showing a detailed configuration of a portion of the display unit 200.

Referring to FIG. 3, a plurality of thin film transistors 220 are formed on the substrate 100, and an organic light emitting diode (OLED) 230 is formed on each of the thin film transistors 220. The OLED 230 includes a pixel electrode 231 electrically connected to the thin film transistor 220, a counter electrode 235 disposed on the entire substrate 100, and intermediate layers 233R, 233G, and 233B. Each of the intermediate layers 233R, 233G, and 233B includes at least an emission layer and is disposed between the pixel electrode 231 and the counter electrode 235.

The thin film transistors 220, each of which includes a gate electrode 221, source and drain electrodes 223, a semiconductor layer 227, a gate insulating layer 213, and an interlayer insulating layer 215, are formed on the substrate 100. However, the embodiment is not limited to the thin film transistors 220 of FIG. 3, and thus other suitable thin film transistors such as an organic thin film transistor including the semiconductor layer 227 formed of an organic material or a silicon thin film transistor formed of silicon may also be used. A buffer layer 211 formed of a silicon oxide or a silicon nitride is further formed between the thin film transistors 220 and the substrate 100, however, the buffer layer 211 may be omitted in some embodiments of the present invention.

The OLED 230 includes the pixel electrode 231, the counter electrode 235 facing the pixel electrode 231, and the intermediate layers 233R, 233G, and 233B. Each of the intermediate layers 233R, 233G, and 233B is formed of an organic material and disposed between the pixel electrode 231 and the counter electrode 235. Each of the intermediate layers 233R, 233G, and 233B, including at least an emission layer, may also include a plurality of layers to be described in more detail later.

The pixel electrode 231 functions as an anode electrode, and the counter electrode 235 functions as a cathode electrode. However, the polarity of the pixel electrode 231 and the counter electrode 235 may be reversed in some embodiments of the present invention.

The pixel electrode 231 may be a transparent electrode or a reflective electrode. When the pixel electrode 231 is a transparent electrode, the pixel electrode 231 may be formed of ITO, IZO, ZnO, and/or $In_2O_3$. When the pixel electrode 231 is a reflective electrode, the pixel electrode 231 may include a reflection layer, which is formed of Ag, Mg, Al, Pt, Pd, Au, Ni, Nd, Ir, and/or Cr, and a layer, which is formed of ITO, IZO, ZnO, and/or $In_2O_3$, formed on the reflection layer.

The counter electrode 235 may be a transparent electrode or a reflective electrode. When the counter electrode 235 is a transparent electrode, the counter electrode 235 may include a layer in which Li, Ca, LiF/Ca, LIF/Al, Al, and/or Mg is deposited toward (or onto) the intermediate layers 233R, 233G, and 233B between the pixel electrode 231 and the counter electrode 235. The counter electrode 235 may also include a bus electrode line and an auxiliary electrode formed of ITO, IZO, ZnO, and/or $In_2O_3$. When the counter electrode 235 is a reflective electrode, the counter electrode 235 may be formed by depositing Li, Ca, LiF/Ca, LiF/Al, Al, and/or Mg on the intermediate layers 233R, 233G, and 233B.

Furthermore, a pixel defining layer (PDL) 219 is formed on the pixel electrode 231 to cover the edges of the pixel electrode 231 with a set or predetermined thickness. The PDL 219 defines a light emitting region and enlarges a gap between the edges of the pixel electrode 231 and the counter electrode 235 so as to reduce the concentration of an electric field on the edge portions (or edges) of the pixel electrode 231, thereby reducing the likelihood of forming a short circuit between the pixel electrode 231 and the counter electrode 235.

The intermediate layers 233R, 233G, and 233B, each including at least an emission layer, may be formed between the pixel electrode 231 and the counter electrode 235. In some embodiments of the present invention, the intermediate layers 233R, 233G, and 233B may be formed of a low molecule organic material or a polymer organic material. The intermediate layers 233R, 233G, and 233B respectively represent red subpixels, green subpixels, and blue subpixels.

When formed of a low molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked together. Examples of the low molecule organic material include copper phthalocyanine (CuPc); N,N'-Di(naphthalene-1-yl)-N,N'-diphenyl-benzidine (NPB); tris-8-hydroxyquinoline aluminum (Alq3); etc. The low molecule organic material may be formed by a vacuum deposition method with a mask.

When formed of a polymer organic material, the intermediate layer 233 may have a structure formed of an HTL and an EML, where the HTL may be formed of poly(3,4-ethylenedioxythiophene) (PEDOT), and the EML may be formed of poly-phenylenevinylene (PPV) and/or polyfluorene.

The OLED 230 is electrically connected to the thin film transistor 220 disposed therebelow. When a planarization layer 217 is formed to cover the thin film transistor 220, the OLED 230 is disposed on the planarization layer 217, and the pixel electrode 231 of the OLED 230 is electrically connected to the thin film transistor 220 via contact holes formed in the planarization layer 217.

The OLED 230 on the substrate 100 is sealed by the encapsulation substrate 300. The encapsulation substrate 300 may be formed of various materials such as a glass or a plastic, as described above. Also, pattern layers and insulating layers, which are to be described later, are respectively formed on the inner surface of the encapsulation substrate 300, thereby realizing a touch panel function.

Hereinafter, the encapsulation substrate 300 and the touch panel related members formed on the surface of the encapsulation substrate 300 in the organic light emitting display device according to the first embodiment of the present invention will be described in more detail.

Figure 4A:
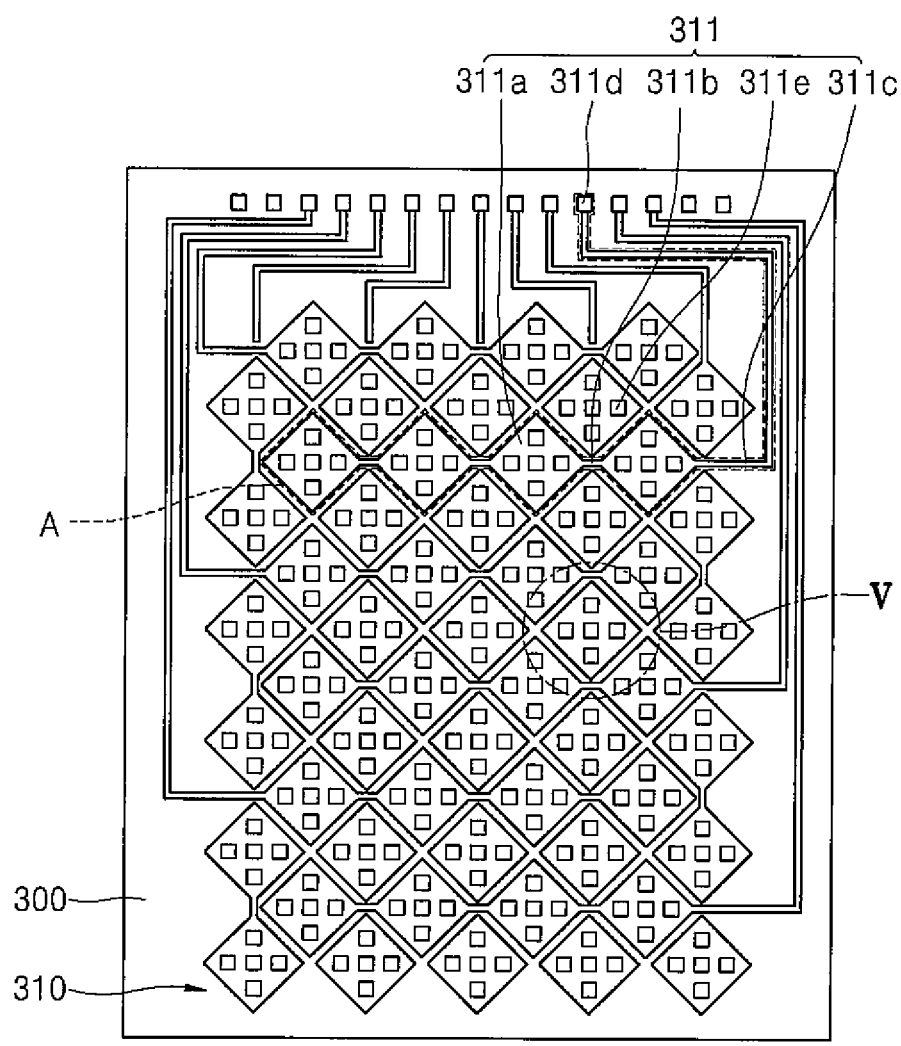
FIGS. 4A and 4B are schematic drawings illustrating bottom views of an encapsulation substrate and a first pattern layer formed on a surface of the encapsulation substrate in the organic light emitting display device of FIG. 1.
Figure 4B:
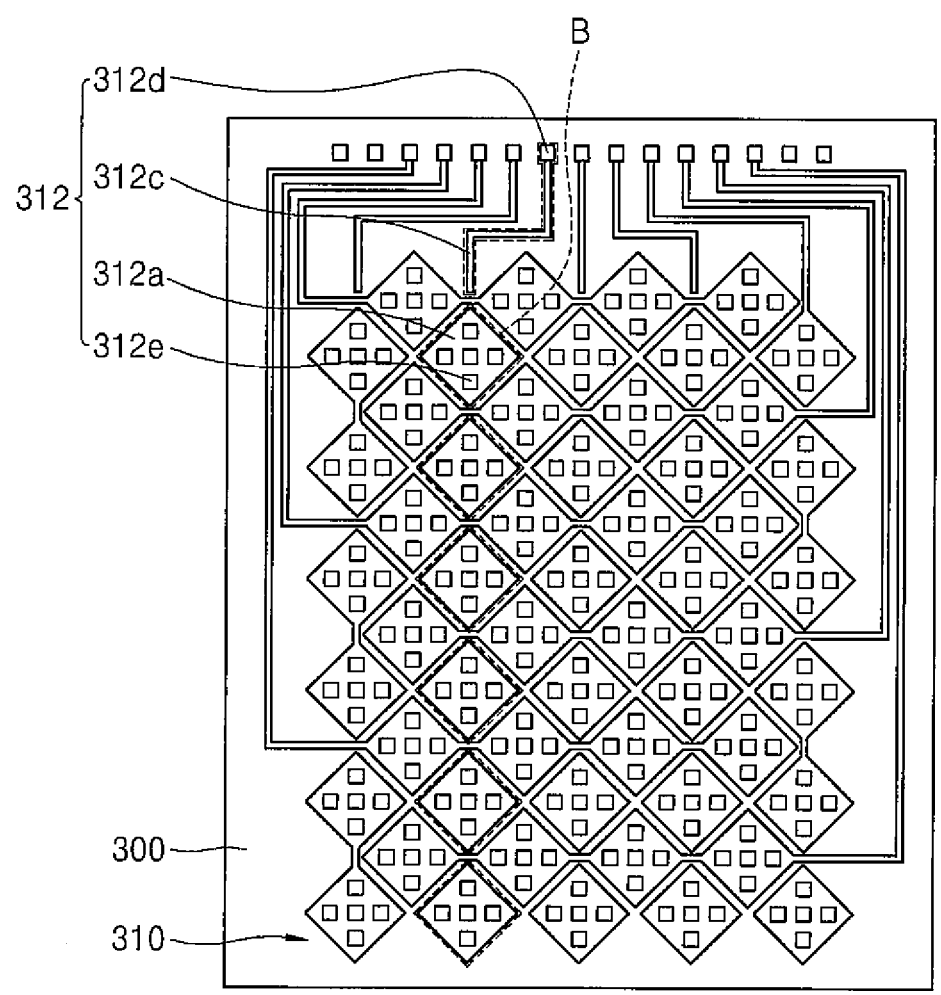
Figure 4B:
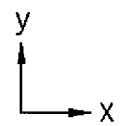
Figure 4C:
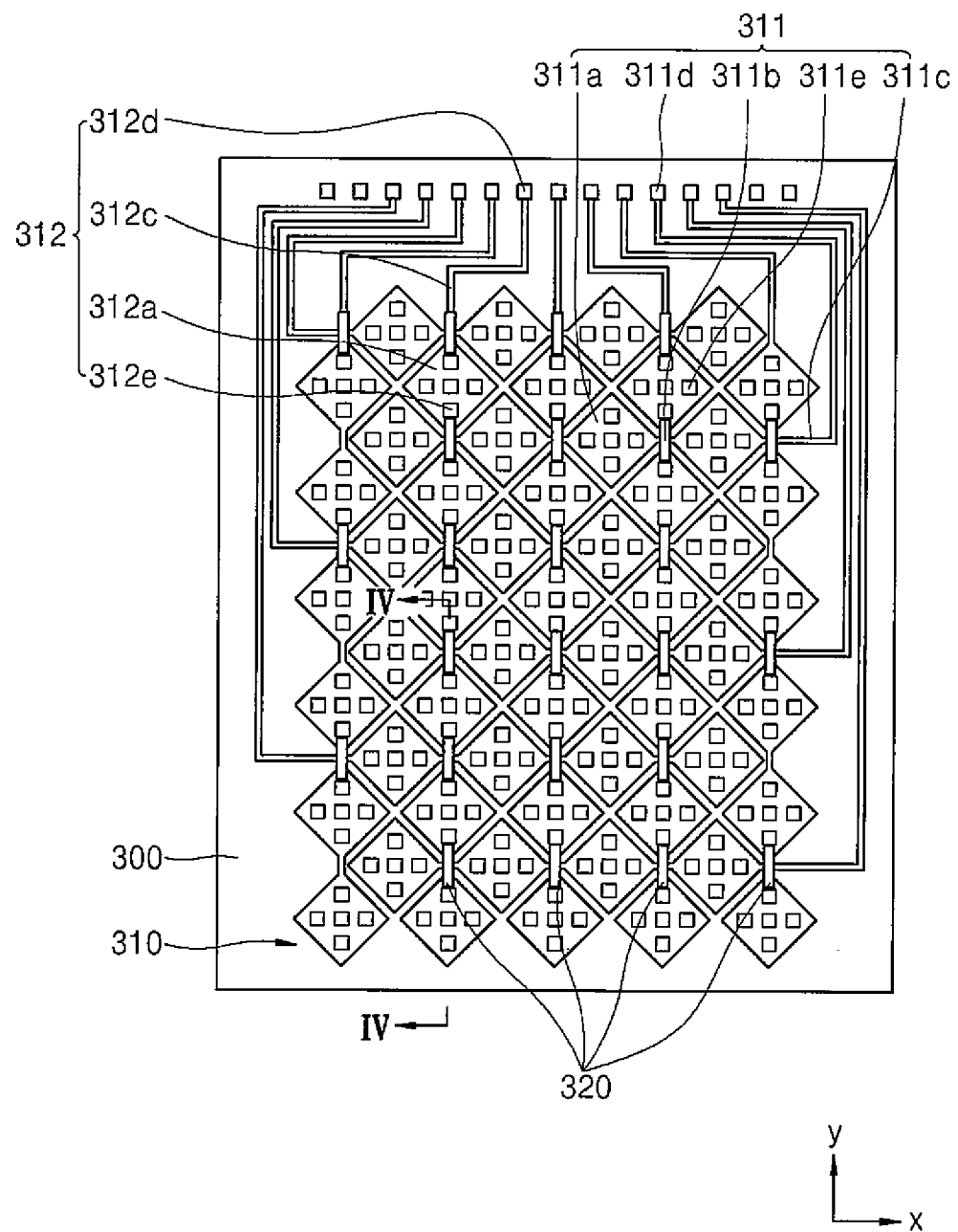
FIG. 4C is a schematic drawing illustrating a bottom view of the first pattern layer of FIGS. 4A and 4B and a second pattern layer on the first pattern layer.
Figure 4D:
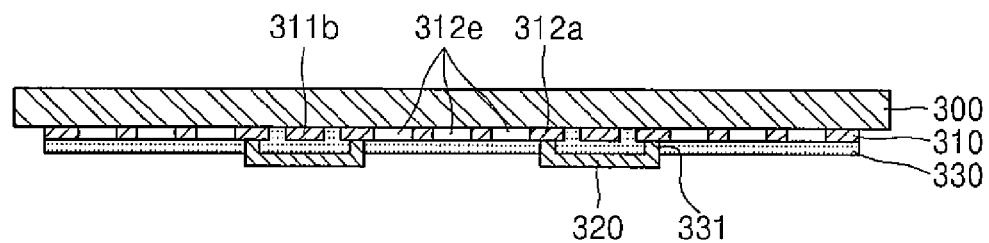
FIG. 4D is a schematic drawing illustrating a cross-sectional view taken along a line IV-IV in FIG. 4C.
Figure 4E:
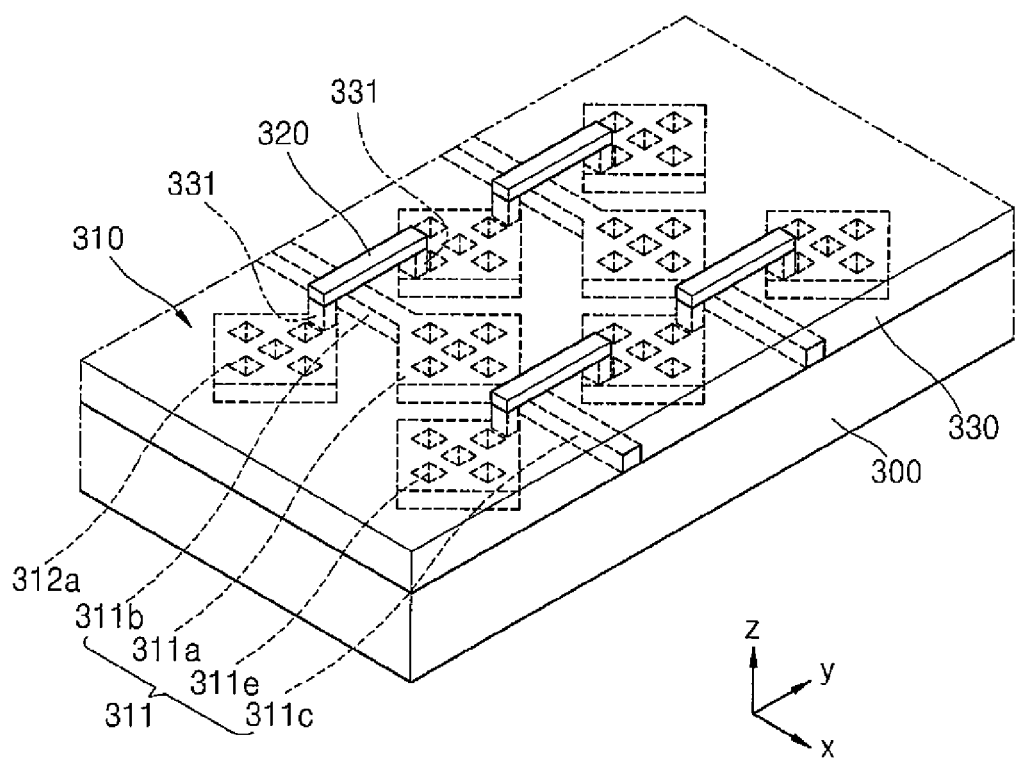
FIG. 4E is a schematic drawing illustrating a perspective view of the first pattern layer and the second pattern layer of FIG. 4C.

FIGS. 4A and 4B are schematic drawings illustrating bottom views of the encapsulation substrate 300 and a first pattern layer formed on a surface of the encapsulation substrate 300 in the organic light emitting display device of FIG. 1. FIG. 4C is a schematic drawing illustrating a bottom view of the first pattern layer of FIGS. 4A and 4B, and a second pattern layer on the first pattern layer. FIG. 4D is a schematic drawing illustrating a cross-sectional view taken along a line IV-IV in FIG. 4C. FIG. 4E is a schematic drawing illustrating a perspective view of the first pattern layer and the second pattern layer of FIG. 4C.

Referring to FIGS. 4A through 4E, a first pattern layer 310, a first insulating layer 330, a second pattern layer 320, and a second insulating layer 340 (see FIG. 7) are respectively formed on a surface of the encapsulation substrate 300 that faces the substrate 100.

In a conventional organic light emitting display device having an internal electrostatic capacitive type touch panel, the thickness of the touch panel is increased in order to realize a touch panel function. According to the first embodiment of the present invention, an indium tin oxide (ITO) pattern is formed on an inner surface of the encapsulation substrate 300 of the organic light emitting display device. In the conventional organic light emitting display device having the internal electrostatic capacitive type touch panel, ITO electrodes are disposed on the entire surface of an encapsulation substrate that provides the touch panel function such that light emitted from OLEDs is absorbed by the ITO electrodes, whereby a luminance of the emitted light is degraded. According to the first embodiment of the present invention, a plurality of openings are formed in the ITO pattern of the organic light emitting display device, whereby the luminance degradation of the light emitted from the OLEDs is improved.

For example, the first pattern layer 310 is formed on the surface of the encapsulation substrate 300 that faces the substrate 100 (see FIG. 1). The first pattern layer 310 includes a plurality of first direction pattern units 311 arranged in parallel rows extending in a first direction (e.g., an X direction in FIG. 4A), and a plurality of second direction pattern units 312 arranged in parallel columns extending in a second direction (e.g., a Y direction in FIG. 4B) that is substantially perpendicular to the first direction. As illustrated in FIGS. 4A and 4B, the first direction pattern units 311 and the second direction pattern units 312 are alternately disposed on the encapsulation substrate 300. That is, the first direction pattern units 311 in each of the parallel rows are arranged with their horizontally opposite corners facing each other along the first direction (e.g., the X direction in FIG. 4A) on the surface of the encapsulation substrate 300, and the second direction pattern units 312 in each of the parallel columns are arranged with their vertically opposite corners facing each other along the second direction (e.g., the Y direction in FIG. 4B).

In FIG. 4A, character A indicates one of the first direction pattern units 311, the first direction pattern units 311 include a plurality of main bodies 311a, a plurality of connecting units 311b, a plurality of extending units 311c, and a plurality of contact units 311d. The main bodies 311a each have a quadrilateral shape (e.g., a diamond shape) and are formed in parallel rows extending in the first direction, i.e., the X direction in FIG. 4A. Each of the connecting units 311b is formed between two of the main bodies 311a and connects the two main bodies 311a that are adjacent to each other. The extending units 311c extend from the ends of the parallel rows of first direction pattern units 311. Furthermore, the extending units 311c may be routed toward one direction, e.g., the Y direction in FIG. 4A, so that the plurality of extending units 311c may gather at one end of the encapsulation substrate 300, for example, an upper end of the encapsulation substrate 300 in FIG. 4A. The contact units 311d are formed at the ends of the extending units 311c, and are electrically connected to a plurality of contact units 112 (see FIG. 7) of the substrate 100 (see FIG. 7) via a conductive member 120 (see FIG. 7) which are to be described later.

A plurality of openings 311e are formed on each of the main bodies 311a in each of the first direction pattern units 311. The openings 311e may be formed to be vertically above the intermediate layers 233R, 233G, and 233B (see FIG. 3). Furthermore, each of the intermediate layers 233R, 233G, and 233B (see FIG. 3) includes at least an emission layer. In this manner, by locating the openings 311e above the emission layer from which light is emitted, the light emitted from the emission layer may pass through the first direction pattern units 311 via the openings 311e without significant reduction in luminance.

Figure 5A:
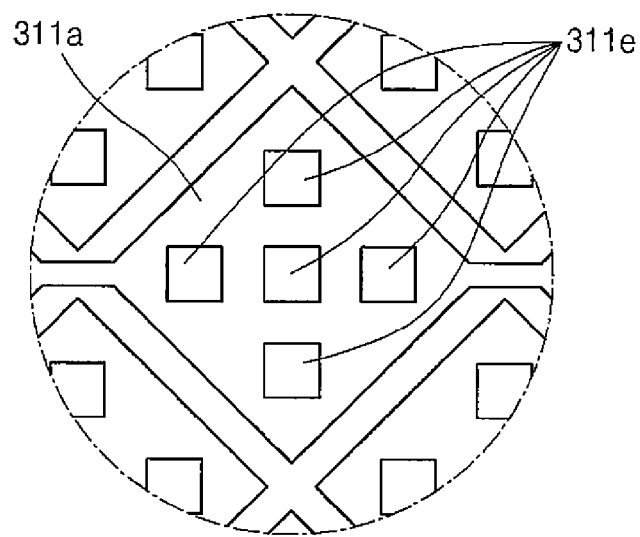
FIGS. 5A and 5B are drawings illustrating magnified views of a portion V of FIG. 4A according to two embodiments of the present invention.
Figure 5B:
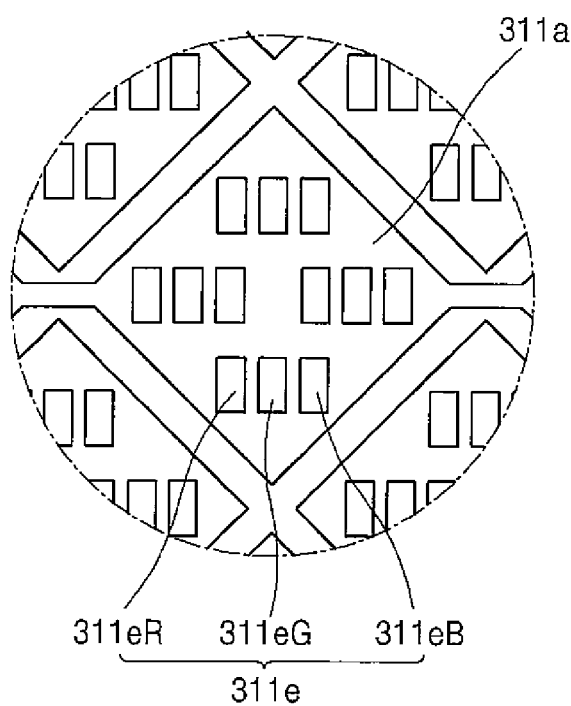

FIG. 5A is a diagram of the openings 311e, wherein each of the openings 311e corresponds to a pixel according to an embodiment of the present invention. FIG. 5B is a diagram of the openings 311e, wherein each of the openings 311e corresponds to a subpixel according to an embodiment of the present invention. That is, as illustrated in FIG. 5A, the openings 311e may be formed to individually correspond to each of a plurality of pixels in the display unit 200 (see FIG. 2), wherein each of the pixels includes R/G/B subpixels. In addition, as illustrated in FIG. 5B, a plurality of openings 311eR, 311eG, and 311eB may be formed to individually correspond to each of the R/G/B subpixels in the display unit 200 (see FIG. 2).

In some embodiments of the present invention, the openings 311e may be formed to have substantially the same shape and size as that of the pixels as illustrated in FIG. 5A, or the openings 311eR, 311eG, and 311eB may be formed to have substantially the same shape and size as that of the subpixels as illustrated in FIG. 5B. However, the present invention is not limited thereto. That is, the shape, size, and arrangement of the openings may vary according to, for example, the shape, size, and arrangement of each pixel and each subpixel.

Referring to FIG. 4B, the reference character B indicates one of the second direction pattern units 312. The second direction pattern units 312 include a plurality of main bodies 312a, extending units 312c, and contact units 312d. The main bodies 312a each have a quadrilateral shape (e.g., a diamond shape), and are formed in parallel columns extending in the second direction, i.e., a Y direction in FIG. 4B. Unlike the first direction pattern units 311, each of the second direction pattern units 312 in FIG. 4B does not include a connecting unit. Thus, the main bodies 312a are connected to each other not by a connecting unit but by the second pattern layer 320 (See FIG. 4C). The extending units 312c extend from the ends of the second direction pattern units 312. Furthermore, the extending units 312c may be routed toward one direction, e.g., the Y direction in FIG. 4B, so that the extending units 312c may gather at one end of the encapsulation substrate 300 such as an upper end of the encapsulation substrate 300 in FIG. 4B. The contact units 312d are formed at the ends of the extending units 312c and are electrically connected to the plurality of contact units 112 (see FIG. 7) of the substrate 100 (see FIG. 7) via the conductive member 120 (see FIG. 7), which are to be described in more detail later.

A plurality of openings 312e are formed in each of the main bodies 312a in each of the second direction pattern units 312. The openings 312e may be formed to be vertically above the intermediate layers 233R, 233G, and 233B (see FIG. 3). Furthermore, each of the intermediate layers 233R, 233G, and 233B (see FIG. 3) includes at least an emission layer. In this manner, by forming the openings 312e above the emission layer from which light is actually emitted, the light emitted from the emission layer may pass through the second direction pattern units 312 via the openings 312e without reduction in luminance.

Referring to FIGS. 4D and 4E, the first insulating layer 330 is formed on the surface of the encapsulation substrate 300 so as to face the substrate 100 and to cover the first pattern layer 310. The first insulating layer 330 insulates the first pattern layer 310 from the second pattern layer 320. A plurality of contact holes 331 may be formed at set or predetermined positions in the first insulating layer 330, e.g., at positions that correspond to corners of the main bodies 312a of the second direction pattern units 312 which face each other. The second pattern layer 320 and the main bodies 312a of the second direction pattern units 312 are connected via the contact holes 331.

As illustrated in FIGS. 4C through 4E, the second pattern layer 320 is formed on a surface of the first insulating layer 330 so as to face the substrate 100. Furthermore, the second pattern layer 320 is formed to fill the contact holes 331 of the first insulating layer 330, thereby electrically connecting the main bodies 312a of the second direction pattern units 312 that are adjacent to each other.

As illustrated in FIG. 4E, the first direction pattern units 311 and the second direction pattern units 312, which are alternately disposed on the encapsulation substrate 300, do not intersect each other, so that a short circuit between the first direction pattern units 311 and the second direction pattern units 312 may be prevented or blocked.

The first pattern layer 310 and the second pattern layer 320 may be formed of transparent materials such as ITO, IZO, ZnO, or $In_2O_3$. Also, the first pattern layer 310 and the second pattern layer 320 may be formed by a photolithography process. That is, an ITO layer, formed by a deposition method, a spin coating method, a sputtering method, and/or an inkjet method, may be patterned to form the first pattern layer 310 and the second pattern layer 320.

The second insulating layer 340 is formed on the surface of the first insulating layer 330 so as to face the substrate 100 and to cover the second pattern layer 320. The second insulating layer 340 insulates the second pattern layer 320 from the display unit 200 (see FIG. 7).

Therefore, according to the first embodiment of the present invention, a touch panel function is realized without increasing the thickness of the touch panel. Also, since an electrostatic capacitive pattern is formed on the inner surface of the encapsulation substrate 300, slim or shallow etching may be performed.

Hereinafter, the connection between a pattern layer of an encapsulation substrate and a printed circuit board (PCB) of a substrate will now be described in more detail.

Figure 6:
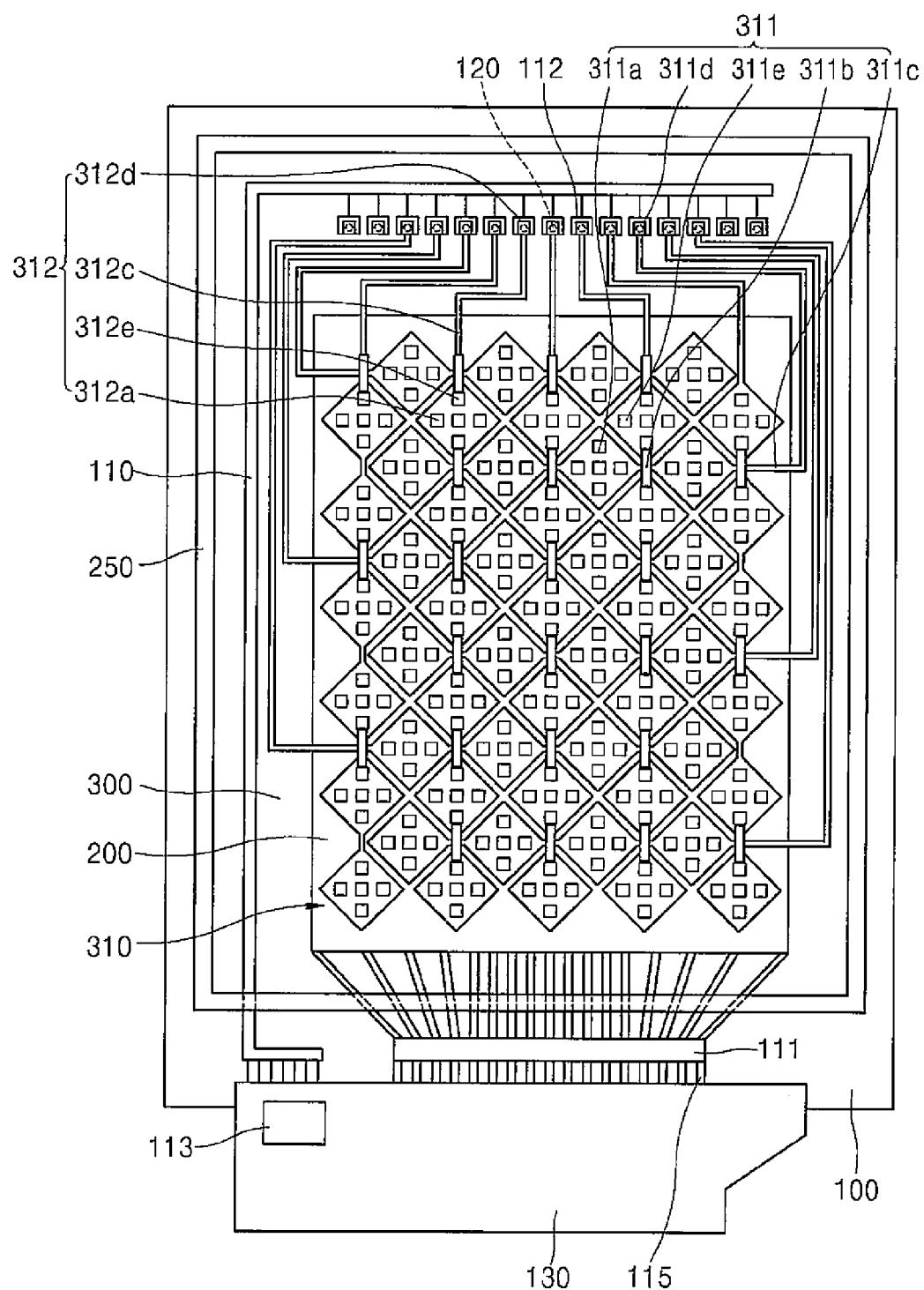
FIG. 6 is a schematic drawing illustrating a plan view of the organic light emitting display device of FIG. 1 with further details.
Figure 7:
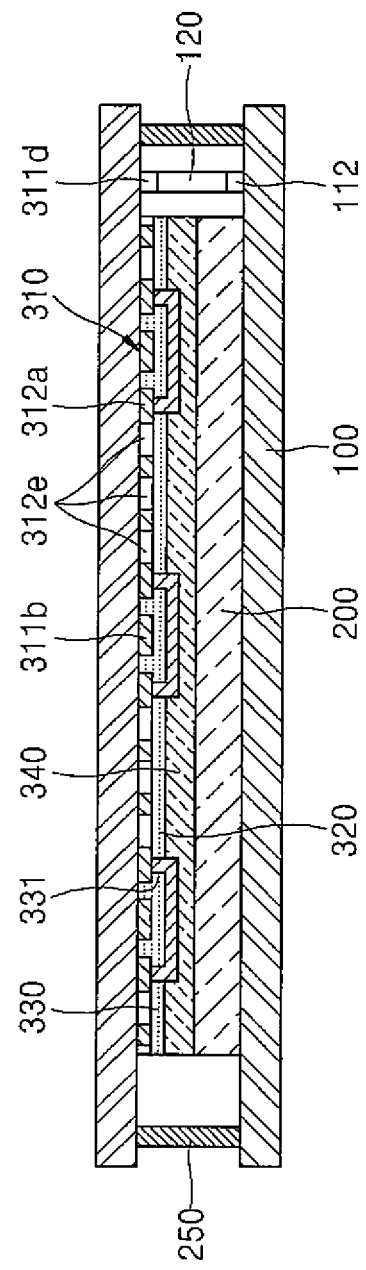
FIG. 7 is a schematic drawing illustrating a cross-sectional view of the organic light emitting display device of FIG. 6.

FIG. 6 is a schematic drawing illustrating a detailed plan view of the organic light emitting display device of FIG. 1 according to the first embodiment of the present invention, and FIG. 7 is a schematic drawing illustrating a cross-sectional view of the organic light emitting display device of FIG. 6.

Referring to FIGS. 6 and 7, the contact units 311d of the first direction pattern units 311 and the contact units 312d of the second direction pattern units 312, which are formed on an encapsulation substrate 300, are electrically connected to a data line 110 formed on the substrate 100. Furthermore, the organic light emitting display device according to the first embodiment of the present invention includes a conductive member 120 (see FIG. 7).

As described above, the display unit 200 for realizing an image is formed on the substrate 100. A flexible PCB 130, on which various kinds of electrical components for drive and control of the display unit 200 are disposed, is arranged along a side the display unit 200. A plurality of first PCB connecting units 115 are formed to connect the display unit 200 to the flexible PCB 130.

The data line 110 is formed around the display unit 200 above the substrate 100. The data line 110 delivers electrical signals, which are generated by the first and the second pattern layers 310 and 320 formed on the inner surface of the encapsulation substrate 300, to the flexible PCB 130. The data line 110 further includes a plurality of contact units 112 and a plurality of second PCB connecting units 113.

The contact units 112 are formed at positions respectively corresponding to the contact units 311d of the first direction pattern units 311 and the contact units 312d of the second direction pattern units 312. The contact units 112 formed above the substrate 100 and the contact units 311d and 312d formed on the encapsulation substrate 300 are electrically connected by the conductive member 120. Various suitable conductive materials including a silver paste may be used as the conductive member 120. Furthermore, the contact units 112 are individually connected to the data line 110 that is connected to the flexible PCB 130 via the second PCB connecting units 113.

Various kinds of electrical components for drive and control of the display unit 200 are disposed on the flexible PCB 130. Furthermore, various electrical components for receiving the electrical signals to drive and control a touch panel may also be disposed on the flexible PCB 130, wherein the electrical signals are generated by the first and the second pattern layers 310 and 320 formed on the inner surface of the encapsulation substrate 300.

According to the first embodiment of the present invention, the organic light emitting display device includes a conventional flexible PCB that may be used in a display device, so as to realize an integrated interface for enabling a touch panel function. As such, the manufacturing cost may be reduced, and the manufacturing process may be improved.

In FIG. 6, the first PCB connecting units 115 connected to the display unit 200 and the second PCB connecting units 113 connected to the data line 110 are separately arranged, and are separately connected to the flexible PCB 130, but the present invention is not limited thereto. That is, the first PCB connecting units 115 and the second PCB connecting units 113 may be formed as a single PCB connecting unit, so that the single PCB connecting unit can be concurrently connected to the display unit 200 and the data line 110. Therefore, the manufacturing cost may be reduced, and the manufacturing process may be improved.

Also, a display drive integrated circuit (DDI) may be formed in the flexible PCB 130 to provide the functions of a touch panel drive integrated circuit (IC). By doing so, the manufacturing costs can be effectively reduced, and the manufacturing process can be simplified.

Hereinafter, a method of driving the organic light emitting display device according to the first embodiment of the present invention will now be described.

Referring back to FIGS. 6 and 7, when a finger, a conductive object, or a high dielectric object approaches or touches a touch sensing surface of the organic light emitting display device according to the first embodiment of the present invention, the organic light emitting display device interprets a change of an electrostatic capacity (capacitance) of conductors caused by such approach, thereby sensing a touch. In response, an output is generated that includes the coordinates of a location on the touch surface that senses the touch and a value representing the strength (e.g., pressure) of the touch.

Furthermore, a constant cathode voltage is applied at the counter electrode 235 (see FIG. 3) of the display unit 200 which contacts the second insulating layer 340. Thus, the first pattern layer 310 and the counter electrode 235 form a capacitor, and the capacitance between the first pattern layer 310 and the counter electrode 235 is maintained constant. When a finger, a conductive object, or a high dielectric object approaches or touches a surface above the encapsulation substrate 300, the finger and the first pattern layer 310 form another capacitor. Thus, these two capacitors are connected in serial, and the total capacitance changes. By sensing the position where the change of the capacitance occurs and a magnitude of the change, a touch sensing system can be realized.

Second Embodiment

Figure 8A:
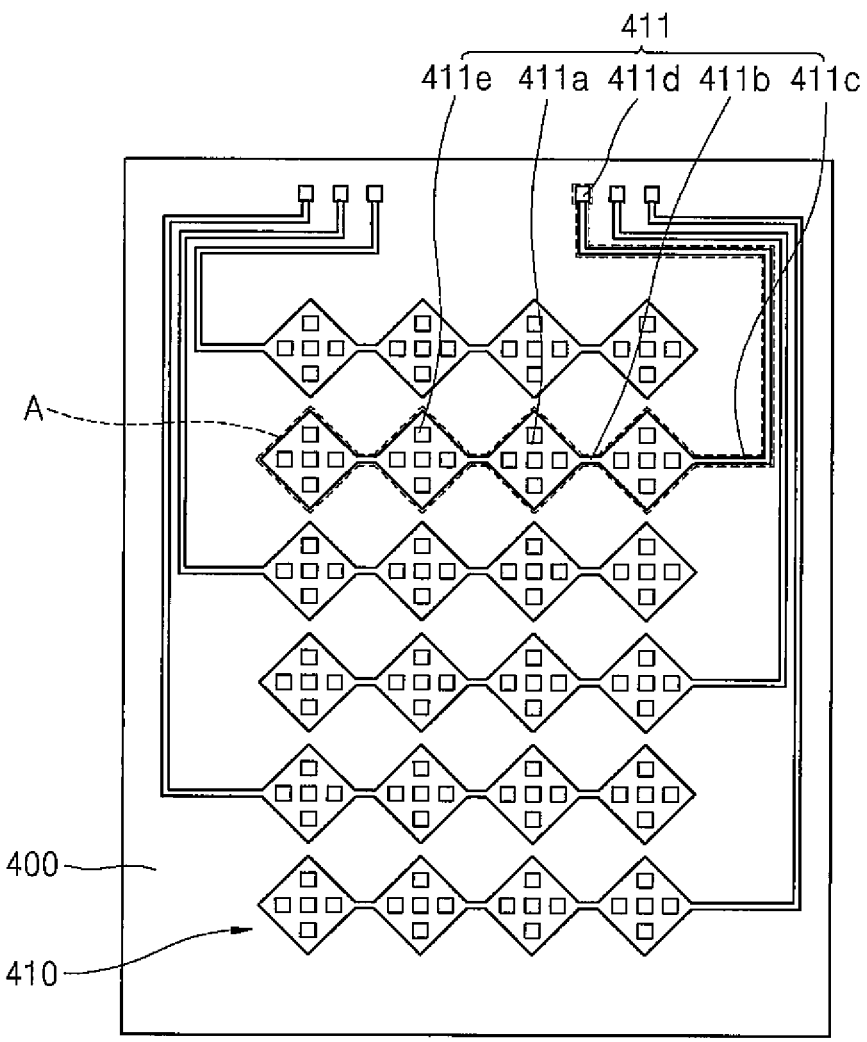
FIG. 8A is a schematic drawing illustrating a bottom view of an encapsulation substrate and a first pattern layer formed on a surface of the encapsulation substrate in an organic light emitting display device according to a second embodiment of the present invention.
Figure 8B:
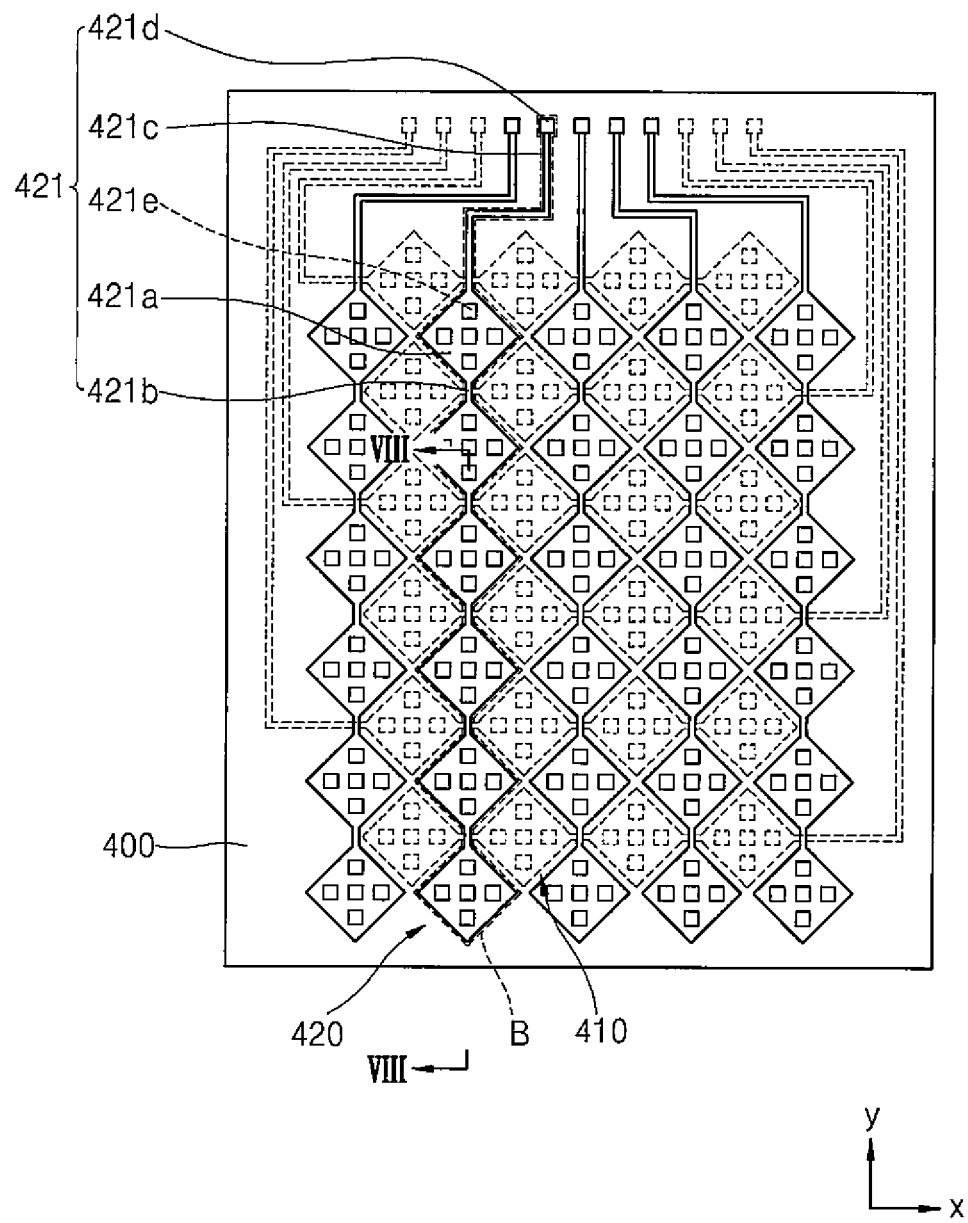
FIG. 8B is a schematic drawing illustrating a bottom view of the first pattern layer of FIG. 8A and a second pattern layer on the first pattern layer.
Figure 8C:
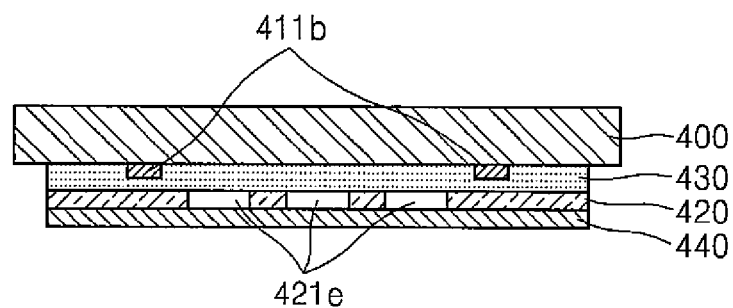
FIG. 8C is a schematic drawing illustrating a cross-sectional view taken along a line VIII-VIII in FIG. 8B.
Figure 8D:
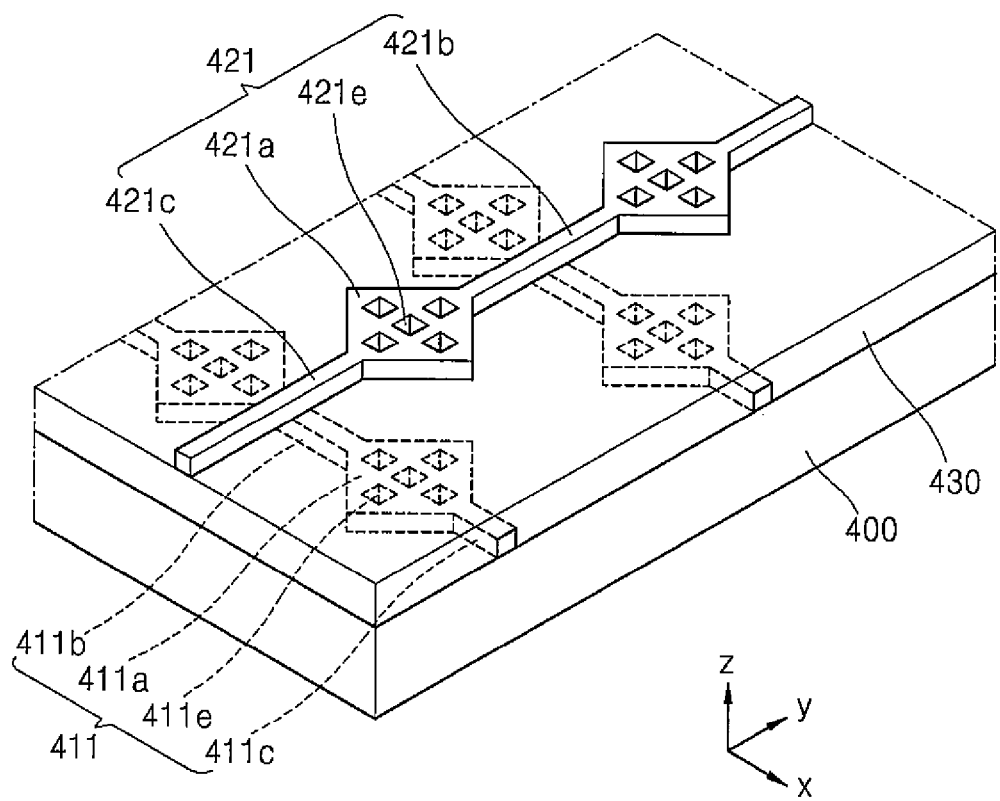
FIG. 8D is a schematic drawing illustrating a perspective view of the first pattern layer and the second pattern layer of FIG. 8B.

FIG. 8A is a schematic drawing illustrating a bottom view of an encapsulation substrate with a first pattern layer formed on a surface of the encapsulation substrate in an organic light emitting display device according to a second embodiment of the present invention. FIG. 8B is a schematic drawing illustrating a bottom view of the first pattern layer of FIG. 8A and a second pattern layer on the first pattern layer. FIG. 8C is a schematic drawing illustrating a cross-sectional view taken along a line VIII-VIII in FIG. 8B. FIG. 8D is a schematic drawing illustrating a perspective view of the first pattern layer and the second pattern layer of FIG. 8B.

Referring to FIGS. 8A through 8D, a first pattern layer 410, a first insulating layer 430, a second pattern layer 420, and a second insulating layer 440 are respectively formed on a surface of an encapsulation substrate 400 so as to face a substrate.

Different from the first embodiment, the second embodiment shown in FIGS. 8A through 8D includes second direction pattern units 421 that are not formed on the first pattern layer 410 while the first direction pattern units 411 are formed on the first pattern layer 410. Instead, the second direction pattern units 421 are formed on the second pattern layer 420.

Furthermore, the first pattern layer 410 is formed on the surface of the encapsulation substrate 400 facing the substrate. The plurality of first direction pattern units 411 of the first pattern layer 410 are arranged in parallel rows extending in a first direction (e.g., an X direction in FIG. 8A). Reference character A illustrated in FIG. 8A indicates one of the first direction pattern units 411.

Referring to the reference character A in FIG. 8A, The first direction pattern units 411 includes a plurality of main bodies 411*a*, a plurality of connecting units 411*b*, a plurality of extending units 411*c*, and a plurality of contact units 411*d*. The main bodies 411*a* have a quadrilateral shape (e.g., a diamond shape) and are arranged in a plurality of parallel rows extending in the first direction, i.e., the X direction in FIG. 8A. Each of the connecting units 411*b* is formed between two adjacent main bodies 411*a*, thereby connecting the adjacent main bodies 411*a*. Each of the extending units 411*c* extends from an end of a row of the first direction pattern units 411. The extending unit 411*c* may be routed toward a same direction, e.g., a Y direction in FIG. 8A, so that the extending units 411*c* may gather at one end of the encapsulation substrate 400, for example, an upper end of the encapsulation substrate 400 in FIG. 8A. The contact units 411*d* are respectively formed at the ends of the extending units 411*c*, and the contact units 411*d* are electrically connected to a data line of the substrate.

A plurality of openings 411*e* are formed in each of the main bodies 411*a*. The openings 411*e* may be formed to be vertically above the intermediate layers 233R, 233G, and 233B (see FIG. 3). Furthermore, each of the intermediate layers 233R, 233G, and 233B (see FIG. 3) includes at least an emission layer. In this manner, by forming the openings 411*e* above the emission layer from which light is emitted, the light emitted from the emission layer can pass through the first direction pattern units 411 via the openings 411*e* without significant luminance reduction.

Referring to FIGS. 8C and 8D, the first insulating layer 430 is formed on the surface of the encapsulation substrate 400 so as to face the substrate and to cover the first pattern layer 410. The first insulating layer 430 insulates the first pattern layer 410 from the second pattern layer 420.

As illustrated in FIGS. 8B through 8D, the second pattern layer 420 is formed on a surface of the first insulating layer 430 so as to face the substrate.

Furthermore, the second pattern layer 420 includes the second direction pattern units 421 formed in parallel columns extending in the second direction (e.g., the Y direction in FIG. 8B). Reference character B illustrated in FIG. 8B indicates one of the second direction pattern units 421. In FIG. 8B, dash lines illustrate the first pattern layer 410 illustrated in FIG. 8A.

Referring to the reference character B in FIG. 8B, the second direction pattern units 421 include a plurality of main bodies 421*a*, a plurality of connecting units 421*b*, a plurality of extending units 421*c*, and a plurality of contact units 421*d*. The main bodies 421*a* each have a quadrilateral shape (e.g., a diamond shape) and are formed in parallel rows extending in the second direction, i.e., the Y direction in FIG. 8B. Each of the connecting units 421*b* is formed between two adjacent main bodies 421*a*, thereby connecting the two adjacent main bodies 421*a* to each other. Each of the extending units 421*c* extends from an end of a column of the second direction pattern units 421. The extending units 421*c* may be routed toward the same direction, e.g., the Y direction in FIG. 8B, so that the extending units 421*c* may gather (or converge) at one end of the encapsulation substrate 400, for example, an upper end of the encapsulation substrate 400 in FIG. 8B. The contact units 421*d* are respectively formed at the ends of the extending unit 421*c* and are electrically connected to the data line of the substrate.

A plurality of openings 421*e* are formed in each of the main bodies 421*a*. The openings 421*e* may be formed to be vertically above the intermediate layers 233R, 233G, and 233B (see FIG. 3). Furthermore, each of the intermediate layers 233R, 233G, and 233B (see FIG. 3) includes at least an emission layer. In this manner, by forming the openings 421*e* above the emission layer from which light is emitted, the light emitted from the emission layer may pass through the second direction pattern units 421 via the openings 421*e* without significant reduction in luminance.

The first pattern layer 410 and the second pattern layer 420 may be formed of a transparent material such as ITO, IZO, ZnO, and/or $In_2O_3$. Also, the first pattern layer 410 and the second pattern layer 420 may be formed by a photolithography process. That is, an ITO layer, formed by a deposition method, a spin coating method, a sputtering method, and/or an inkjet method, may be patterned to form the first pattern layer 410 and the second pattern layer 420.

The second insulating layer 440 is formed on the surface of the first insulating layer 430 so as to face the substrate and to cover the second pattern layer 420. The second insulating layer 440 insulates the second pattern layer 420 from the display unit 200 (see FIG. 7).

In this manner, according to the embodiments of the present invention, it is possible to realize a touch panel function without increasing the thickness of a touch panel. Also, since an electrostatic capacitive pattern is formed on an inner surface of the encapsulation substrate 400, slim or shallow etching is possible.

According to the embodiments of the present invention, a touch panel function may be incorporated in the organic light emitting display device without significant increase in the thickness of the touch panel and without significant reduction in luminance.

While the present invention has been particularly shown and described with reference to exemplary embodiments thereof, it will be understood by one of ordinary skill in the art that various changes in form and details may be made therein without departing from the spirit and scope of the present invention as defined by the following claims and equivalents thereof.

What is claimed is:

1. A display panel comprising:
   a substrate;
   a display unit on the substrate, the display unit comprising a plurality of pixels; and
   a touch sensing unit on the display unit, the touch sensing unit comprising:
   an encapsulation substrate sealing the display unit; and
   a capacitive pattern layer on one side of the encapsulation substrate, the capacitive pattern layer having a plurality of openings corresponding in position to the plurality of pixels, at least one of the pixels being aligned with a corresponding one of the openings along a direction perpendicular to the substrate,
   wherein the capacitive pattern layer comprises a plurality of first pattern units arranged in columns extending in a first direction and a plurality of second pattern units arranged in rows extending in a second direction crossing the first direction, and
   wherein the plurality of first pattern units and the plurality of second pattern units are on a same side of the encapsulation substrate.

2. The display panel of claim 1, wherein the first and second pattern units are arranged in a matrix pattern.

3. The display panel of claim 2, wherein each of the first and second pattern units has at least one of the plurality of openings.

4. The display panel of claim 2, wherein the plurality of first pattern units are electrically coupled to each other.

5. The display panel of claim 2, further comprising a first insulation layer on the plurality of first pattern units and the plurality of second pattern units.

6. The display panel of claim 5, further comprising a plurality of connectors on the first insulation layer for electrically coupling adjacent units of the plurality of second pattern units.

7. The display panel of claim 6, further comprising a second insulation layer on the plurality of connectors.

8. The display panel of claim 2, wherein each of the first and second pattern units has a substantially quadrilateral shape.

9. The display panel of claim 2, wherein each of the first and second pattern units has a substantially diamond or rectangular shape.

10. The display panel of claim 1, wherein an opening of the plurality of openings corresponds in position to at least one pixel of the plurality of pixels.

11. The display panel of claim 10, wherein the opening of the plurality of openings corresponds in position to only one pixel of the plurality of pixels.

12. The display panel of claim 11, wherein the pixel is a subpixel.

13. The display panel of claim 11, wherein a center of the opening is substantially aligned with a center of the pixel in a direction substantially normal to the side of the encapsulation substrate.

14. The display panel of claim 1, wherein each of the plurality of openings has substantially the same shape as that of a corresponding pixel of the plurality of pixels.

15. The display panel of claim 1, wherein an opening of the plurality of openings has an area substantially identical to or larger than an area of a pixel of the plurality of pixels in size.

16. The display panel of claim 1, wherein the plurality of openings are arranged in a pattern corresponding to an arrangement pattern of the plurality of pixels.

17. The display panel of claim 1, wherein the plurality of openings are identical to or less than the plurality of pixels in number.

18. The display panel of claim 1, wherein the touch sensing unit further comprises a plurality of extending units on the side of the encapsulation substrate for electrically coupling the capacitive pattern layer to the substrate.

19. The display panel of claim 18, further comprising a conductive member between the substrate and the touch sensing unit for coupling the plurality of extending units to the substrate.

20. The display panel of claim 1, wherein the capacitive pattern layer comprises a material selected from the group consisting of ITO, IZO, ZnO, In2O3, and combinations thereof.

21. The display panel of claim 1, wherein the display unit is an organic light emitting display.

22. A display panel comprising:
   a substrate;
   a display unit on the substrate, the display unit comprising a plurality of pixels; and
   a touch sensing unit on the display unit, the touch sensing unit comprising: an encapsulation substrate; and
   a capacitive pattern layer on any one side of the encapsulation substrate, the capacitive pattern layer having a plurality of openings corresponding in position to the plurality of pixels,
   wherein the capacitive pattern layer comprises a plurality of pattern units arranged in a matrix pattern,
   wherein the plurality of pattern units comprise a plurality of first pattern units arranged in columns extending in a first direction and a plurality of second pattern units arranged in rows extending in a second direction crossing the first direction,
   wherein the display panel further comprises a first insulation layer between the plurality of first pattern units and the plurality of second pattern units, and
   wherein the plurality of first pattern units are between the encapsulation substrate and the first insulation layer, and the plurality of second pattern units are on the first insulation layer.

23. The display panel of claim 22, further comprising a second insulation layer on the plurality of second pattern units.

24. A method of fabricating a display panel having a touch sensing interface, the method comprising:
   providing a display unit on a substrate, the display unit comprising a plurality of pixels;
   forming a capacitive pattern layer on any one side of an encapsulation substrate that seals the display unit;
   forming a plurality of openings in the capacitive pattern layer corresponding in position to the plurality of pixels; and
   attaching the encapsulation substrate to the substrate with the display unit, at least one of the pixels being aligned with a corresponding one of the openings along a direction perpendicular to the substrate,
   wherein the capacitive pattern layer comprises a plurality of first pattern units arranged in columns extending in a first direction and a plurality of second pattern units arranged in rows extending in a second direction crossing the first direction, and wherein the plurality of first pattern units and the plurality of second pattern units are on a same side of the encapsulation substrate.

* * * * *